United States Patent
Kim et al.

(10) Patent No.: US 10,930,651 B2
(45) Date of Patent: Feb. 23, 2021

(54) SEMICONDUCTOR DEVICE

(71) Applicant: Samsung Electronics Co., Ltd., Suwon-si (KR)

(72) Inventors: Ju Youn Kim, Suwon-si (KR); Se Ki Hong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 63 days.

(21) Appl. No.: 16/238,988

(22) Filed: Jan. 3, 2019

(65) Prior Publication Data

US 2019/0214388 A1 Jul. 11, 2019

(30) Foreign Application Priority Data

Jan. 9, 2018 (KR) .................. 10-2018-0002753

(51) Int. Cl.
*H01L 27/092* (2006.01)
*H01L 29/49* (2006.01)
*H01L 29/423* (2006.01)
*H01L 21/8238* (2006.01)
*H01L 29/78* (2006.01)
*H01L 29/775* (2006.01)
*H01L 29/739* (2006.01)
*H01L 29/51* (2006.01)
*H01L 27/11* (2006.01)

(52) U.S. Cl.
CPC .. *H01L 27/0922* (2013.01); *H01L 21/823821* (2013.01); *H01L 21/823842* (2013.01); *H01L 27/0924* (2013.01); *H01L 29/42376* (2013.01); *H01L 29/4966* (2013.01); *H01L 29/7854* (2013.01); *H01L 27/1116* (2013.01); *H01L 29/513* (2013.01); *H01L 29/7391* (2013.01); *H01L 29/775* (2013.01)

(58) Field of Classification Search
CPC ......... H01L 27/11521; H01L 27/11526; H01L 29/66825; H01L 29/42328; H01L 29/788; H01L 29/4916; H01L 23/3171; H01L 23/291; H01L 27/0922
See application file for complete search history.

(56) References Cited

U.S. PATENT DOCUMENTS

| | | |
|---|---|---|
| 6,861,712 B2 | 3/2005 | Gao et al. |
| 7,718,496 B2 | 5/2010 | Frank et al. |

(Continued)

*Primary Examiner* — Kyoung Lee
*Assistant Examiner* — Christina A Sylvia
(74) *Attorney, Agent, or Firm* — Harness, Dickey & Pierce, P.L.C.

(57) ABSTRACT

A semiconductor device includes a substrate including a first area and a second area, and first and second transistors formed in the first area and the second area, respectively. The first transistor includes a first gate insulating layer on the substrate, a first TiN layer on the first gate insulating layer contacting the first gate insulating layer, and a first filling layer on the first TiN layer. The second transistor includes a second gate insulating layer on the substrate, a second TiN layer on the second gate insulating layer contacting the second gate insulating layer, and a second filling layer on the second TiN layer. A threshold voltage of the first transistor is less than that of the second transistor, the second gate insulating layer does not comprise lanthanum, and an oxygen content of a portion of the first TiN layer is greater than that of the second TiN layer.

20 Claims, 12 Drawing Sheets

(56) References Cited

U.S. PATENT DOCUMENTS

| | | | |
|---|---|---|---|
| 8,088,685 B2 | 1/2012 | Lin et al. | |
| 8,183,641 B2 | 5/2012 | Inumiya et al. | |
| 8,865,581 B2 | 10/2014 | Clark | |
| 9,013,000 B2 | 4/2015 | Choi | |
| 9,105,745 B2 | 8/2015 | Ando et al. | |
| 9,362,180 B2 | 6/2016 | Lee et al. | |
| 9,401,362 B2 | 7/2016 | Zang | |
| 9,406,678 B2 | 8/2016 | Ji et al. | |
| 9,418,899 B1 | 8/2016 | Shen et al. | |
| 9,461,132 B2 | 10/2016 | Cheon et al. | |
| 9,502,416 B1 | 11/2016 | Kim | |
| 9,553,092 B2 | 1/2017 | Bao et al. | |
| 9,576,952 B2 | 2/2017 | Joshi et al. | |
| 9,620,610 B1 * | 4/2017 | Jangjian | H01L 21/82382 |
| 9,659,937 B2 | 5/2017 | Chang et al. | |
| 9,859,393 B2 * | 1/2018 | Tak | H01L 21/76831 |
| 2013/0341631 A1 * | 12/2013 | Maeda | H01L 21/02636 257/64 |
| 2015/0187763 A1 * | 7/2015 | Kim | H01L 21/28202 257/392 |
| 2016/0225868 A1 | 8/2016 | Kim et al. | |
| 2017/0213826 A1 | 7/2017 | Kim et al. | |

* cited by examiner

SEMICONDUCTOR DEVICE

This application claims the benefit of Korean Patent Application No. 10-2018-0002753, filed on Jan. 9, 2018, in the Korean Intellectual Property Office, the disclosure of which is incorporated herein in its entirety by reference.

BACKGROUND

Inventive concepts relate to a semiconductor device.

A semiconductor device may include transistors having different threshold voltages. Examples of transistors having different threshold voltages include a combination of a logic transistor and a static random access memory (SRAM) transistor or a dynamic random access memory (DRAM) transistor.

Meanwhile, various methods of controlling the threshold voltages of transistors included in a semiconductor device are being studied.

SUMMARY

Aspects of inventive concepts provide a semiconductor device including a plurality of transistors having different threshold voltages.

However, aspects of inventive concepts are not restricted to the one set forth herein. The above and other aspects of inventive concepts will become more apparent to one of ordinary skill in the art to which inventive concepts pertains by referencing the detailed description of inventive concepts given below.

According to some example embodiments of inventive concepts, there is provided a semiconductor device comprising a substrate including a first area and a second area, and first and second transistors formed in the first area and the second area, respectively. The first transistor includes a first gate insulating layer on the substrate, a first TiN layer on the first gate insulating layer contacting the first gate insulating layer, and a first filling layer on the first TiN layer, and the second transistor includes a second gate insulating layer on the substrate, a second TiN layer on the second gate insulating layer contacting the second gate insulating layer, and a second filling layer on the second TiN layer. A threshold voltage of the first transistor is less in absolute value than that of the second transistor, the second gate insulating layer does not comprise a lanthanum-based material, and an oxygen content of a portion of the first TiN layer is greater than that of an oxygen content of the second TiN layer.

According to some example embodiments of inventive concepts, there is provided a semiconductor device comprising a substrate including first, second, third, fourth, fifth, and sixth areas, first, second, and third transistors respectively formed in the first through third areas, the first through third transistors being PMOS transistors, and fourth, fifth, and sixth transistors respectively formed in the fourth through sixth areas, the fourth through sixth transistors being NMOS transistors. The first transistor includes a first gate insulating layer on the substrate, a first TiN layer on the first gate insulating layer contacting the first gate insulating layer, and a first filling layer on the first TiN layer, the second transistor includes a second gate insulating layer on the substrate, a second TiN layer on the second gate insulating layer contacting the second gate insulating layer, and a second filling layer on the second TiN layer, the third transistor includes a third gate insulating layer on the substrate, a third TiN layer on the third gate insulating layer contacting the third gate insulating layer, and a third filling layer on the third TiN layer, the fourth transistor includes a fourth gate insulating layer on the substrate, a fourth TiN layer on the fourth gate insulating layer contacting the fourth gate insulating layer, and a fourth filling layer on the fourth TiN layer, the fifth transistor includes a fifth gate insulating layer on the substrate, a fifth TiN layer on the fifth gate insulating layer contacting the fifth gate insulating layer, and a fifth filling layer on the fifth TiN layer, and the sixth transistor includes a sixth gate insulating layer on the substrate, a sixth TiN layer on the sixth gate insulating layer contacting the sixth gate insulating layer, and a sixth filling layer on the sixth TiN layer. A second thickness of the second TiN layer is less than a first thickness of the first TiN layer and greater than a third thickness of the third TiN layer, a fourth thickness of the fourth TiN layer and a fifth thickness of the fifth TiN layer are less than a sixth thickness of the sixth TiN layer, the fourth gate insulating layer comprises a lanthanum-based material, and the second gate insulating layer does not comprise a lanthanum-based material.

According to some example embodiments of inventive concepts, there is provided a semiconductor device comprising a substrate comprising first, second, and third areas, first, second, and third transistors respectively formed in the first through third areas, the first through third transistors being PMOS transistors. The first transistor includes a first gate insulating layer on the substrate, a first TiN layer on the first gate insulating layer contacting the first gate insulating layer, and a first filling layer on the first TiN layer, the second transistor includes a second gate insulating layer on the substrate, a second TiN layer on the second gate insulating layer contacting the second gate insulating layer, and a second filling layer on the second TiN layer, and the third transistor includes a third gate insulating layer on the substrate, a third TiN layer on the third gate insulating layer contacting the third gate insulating layer, and a third filling layer on the third TiN layer. A second thickness of the second TiN layer is less than a first thickness of the first TiN layer and greater than a third thickness of the third TiN layer, and an oxygen content of a portion of the first TiN layer is greater than an oxygen content of the second TiN layer and an oxygen content of the third TiN layer.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION OF EXAMPLE EMBODIMENTS

Figure 1:
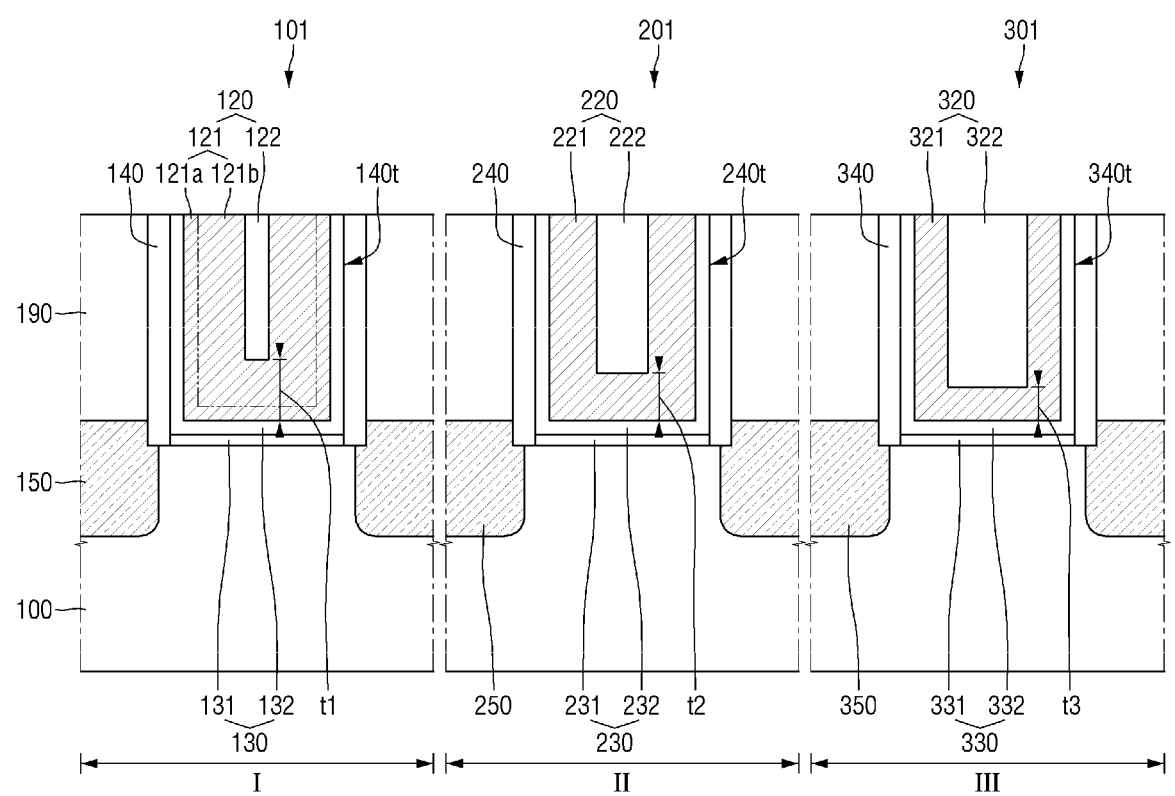
FIGS. 1 through 4 respectively illustrate semiconductor devices according to example embodiments.

In the drawings relating to semiconductor devices according to example embodiments, a fin field effect transistor (FinFET) including a channel region of a fin pattern shape is illustrated by way of example. However, example embodiments are not limited to the FinFET. The semiconductor devices according to the example embodiments may also include a tunneling FET, a transistor including nanowires, a transistor including a nanosheet, or a three-dimensional (3D) transistor. In addition, the semiconductor devices according to the example embodiments may include a bipolar junction transistor, a lateral double diffusion transistor (LDMOS), or the like.

FIG. 1 illustrates a semiconductor device according to example embodiments.

Referring to FIG. 1, the semiconductor device according to the example embodiments may include first, second, and third transistors 101, 201 and 301 formed on a substrate 100.

The substrate 100 may include first, second, and third areas I, II and III. The first, second, and third areas I, II and III may be separated from each other or may be connected to each other. The first, second, and third areas I, II and III may be included in a portion performing the same function, for example, in a logic area or an input/output (I/O) area. Alternatively, each of the first, second, and third areas I, II and III may be included in one of portions performing different functions, for example, one of a logic area, a static random access memory (SRAM) area and an I/O area.

In the semiconductor device according to the example embodiments described with reference to FIG. 1, each of the first, second, and third areas I, II and III may be an area in which a p-channel metal oxide semiconductor (PMOS) transistor is formed.

The substrate 100 may be or include a bulk silicon substrate or a silicon-on-insulator (SOI) substrate. Otherwise, the substrate 100 may be or include, but is not limited to, a silicon substrate or a substrate made of another material such as silicon germanium, silicon germanium-on-insulator (SGOI), indium antimonide, lead telluride, indium arsenide, indium phosphide, gallium arsenide or gallium antimonide. In the following description, it is assumed, for case of description, that the substrate 100 is assumed to be a substrate containing silicon.

The first transistor 101 may be formed in the first area I, the second transistor 201 may be formed in the second area II, and the third transistor 301 may be formed in the third area III. Since each of the first, second, and third areas I, II and III is an area in which a PMOS transistor is formed, each of the first, second, and third transistors 101, 201 and 301 may be a p-type transistor.

The first transistor 101 may include a first gate insulating layer 130, a first gate electrode structure 120, first gate spacers 140, and first source/drain regions 150. The second transistor 201 may include a second gate insulating layer 230, a second gate electrode structure 220, second gate spacers 240, and second source/drain regions 250. The third transistor 301 may include a third gate insulating layer 330, a third gate electrode structure 320, third gate spacers 340, and third source/drain regions 350.

The elements included in each of the first, second, and third transistors 101, 201 and 301 will be described below.

An interlayer insulating film 190 may be formed on the substrate 100 of the first, second, and third areas I, II and III. The interlayer insulating film 190 may include first, second, and third trenches 140t, 240t and 340t.

The first, second, and third trenches 140t, 240t and 340t may correspond to the first, second, and third areas I, II and III, respectively. That is, the first trench 140t may be formed on the substrate 100 of the first area I, the second trench 240t may be formed on the substrate 100 of the second area II, and the third trench 340t may be formed on the substrate 100 of the third area III.

The interlayer insulating film 190 may include at least one of, for example, silicon oxide, silicon nitride, silicon oxynitride, and a low dielectric constant (low-k) material. Examples of the low-k material may include, but are not limited to, flowable oxide (FOX), tonen silazen (TOSZ), undoped silicate glass (USG), borosilicate glass (BSG), phosphosilicate glass (PSG), borophosphosilicate glass (BPSG), plasma enhanced tetraethylorthosilicate (PE-TEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, a porous polymeric material, and combinations of the same.

The first gate spacers 140 may be formed on the substrate 100 of the first area I. The first gate spacers 140 may define the first trench 140t. The first trench 140t may have, for example, the first gate spacers 140 as sidewalls and an upper surface of the substrate 100 as a bottom surface.

The second gate spacers 240 defining the second trench 240t may be formed on the substrate 100 of the second area II. The third gate spacers 340 defining the third trench 340t may be formed on the substrate 100 of the third area III.

Each of the first, second, and third gate spacers 140, 240 and 340 may include silicon nitride (SiN), silicon oxynitride (SiON), silicon oxide (SiO$_2$), silicon oxycarbonitride (SiOCN), and combinations of the same.

Although each of the first, second, and third gate spacers 140, 240 and 340 is illustrated as being a single layer, this is merely an example used for ease of description, and each of the first, second third gate spacers 140, 240 and 340 is not necessarily a single layer. When each of the first, second, and third gate spacers 140, 240 and 340 includes a plurality of layers, at least one of the layers included in each of the first, second, and third gate spacers 140, 240 and 340 may contain a low-k material such as silicon oxycarbonitride (SiOCN).

In addition, when each of the first, second, and third gate spacers 140, 240 and 340 includes a plurality of layers, at least one of the layers included in each of the first, second, and third gate spacers 140, 240 and 340 may be L-shaped.

In some cases, each of the first, second, and third gate spacers 140, 240 and 340 may serve as a guide for forming a self-aligned contact. Accordingly, each of the first, second, and third gate spacers 140, 240 and 340 may include a material having an etch selectivity with respect to the interlayer insulating film 190.

The first gate insulating layer 130 may be formed on the substrate 100 of the first area I. The first gate insulating layer 130 may extend along the sidewalls and bottom surface of the first trench 140t. The first gate insulating layer 130 may include a first interfacial layer 131 and a first high dielectric constant (high-k) insulating layer 132.

The first interfacial layer 131 may be formed on the substrate 100. The first interfacial layer 131 may be formed on the bottom surface of the first trench 140t. The first high-k insulating layer 132 may be formed on the first interfacial layer 131. The first high-k insulating layer 132 may be formed along the bottom and sidewalls of the first trench 140t.

The second gate insulating layer 230 may be formed on the substrate 100 of the second area II. The second gate insulating layer 230 may extend along sidewalls and a bottom surface of the second trench 240t. The second gate insulating layer 230 may include a second interfacial layer 231 and a second high-k insulating layer 232.

The second interfacial layer 231 may be formed on the substrate 100. The second interfacial layer 231 may be formed on the bottom surface of the second trench 240t. The second high-k insulating layer 232 may be formed on the second interfacial layer 231. The second high-k insulating layer 232 may be formed along the bottom surface and sidewalls of the second trench 240t.

The third gate insulating layer 330 may be formed on the substrate 100 of the third area III. The third gate insulating layer 330 may extend along sidewalls and a bottom surface of the third trench 340t. The third gate insulating layer 330 may include a third interfacial layer 331 and a third high-k insulating layer 332.

The third interfacial layer 331 may be formed on the substrate 100. The third interfacial layer 331 may be formed on the bottom surface of the third trench 340t. The third high-k insulating layer 332 may be formed on the third interfacial layer 331. The third high-k insulating layer 332 may be formed along the bottom surface and sidewalls of the third trench 340t.

Although the first, second, and third interfacial layers 131, 231 and 331 are illustrated as not being formed on the sidewalls of the first, second, and third trenches 140t, 240t and 340t, embodiments are not limited to this case. For example, the first, second, and third interfacial layers 131, 231 and 331 can also be formed on the sidewalls of the first, second, and third trenches 140t, 240t and 340t depending on a method of forming the first, second, and third interfacial layers 131, 231 and 331.

Each of the first, second, and third interfacial layers 131, 231 and 331 may include, for example, silicon oxide. However, each of the first, second, and third interfacial layers 131, 231 and 331 may not necessarily include silicon oxide. For example, each of the first, second, and third interfacial layers 131, 231 and 331 may include a different material depending on the type of the substrate 100 or the type of the first, second or third high-k insulating layer 132, 232 or 332.

Each of the first, second, and third high-k insulating layers 132, 232 and 332 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In addition, while the first, second, and third high-k insulating layers 132, 232 and 332 including oxides have mainly been described, the first, second, and third high-k insulating layers 132, 232 and 332 can also include, but not limited to, one or more of nitrides (e.g., hafnium nitride) and oxynitrides (e.g., hafnium oxynitride) of the above metallic materials.

In some example embodiments, each of the first, second, and third gate insulating layers 130, 230 and 330 may not include a lanthanum-based material. For example, each of the first, second, and third high-k insulating layers 132, 232 and 332 may not include a lanthanum-based material. For example, each of the first, second, and third gate insulating layers 130, 230 and 330 may not include lanthanum oxide.

The first gate electrode structure 120 may be formed on the first gate insulating layer 130. The first gate electrode structure 120 may fill the first trench 140t. The first gate electrode structure 120 may include a first TiN layer 121 and a first filling layer 122.

The first TiN layer 121 may be formed on the first gate insulating layer 130. The first TiN layer 121 may contact the first gate insulating layer 130. The first TiN layer 121 may extend along the sidewalls and bottom surface of the first trench 140t. The first TiN layer 121 may be formed along the profile of the first gate insulating layer 130.

The first TiN layer 121 may include a first portion 121a and a second portion 121b. The first portion 121a of the first TiN layer 121 may be on the first gate insulating layer 130 along the profile of the first gate insulating layer 130. The first portion 121a of the first TiN layer 121 may contact the first gate insulating layer 130.

The second portion 121b of the first TiN layer 121 may be on the first portion 121a of the first TiN layer 121 along the profile of the first portion 121a of the first TiN layer 121.

The first portion 121a and the second portion 121b of the first TiN layer 121 may include TiN but may differ in oxygen content. This will be described in detail later.

The first filling layer 122 may be formed on the first TiN layer 121. For example, the first filling layer 122 may contact the first TiN layer 121. The first filling layer 122 may fill the remaining space of the first trench 140t in which the first TiN layer 121 is located.

The second gate electrode structure 220 may be formed on the second gate insulating layer 230. The second gate electrode structure 220 may fill the second trench 240t. The second gate electrode structure 220 may include a second TiN layer 221 and a second filling layer 222.

The second TiN layer 221 may be formed on the second gate insulating layer 230. The second TiN layer 221 may contact the second gate insulating layer 230. The second TiN layer 221 may extend along the sidewalls and bottom surface of the second trench 240t. The second TiN layer 221 may be formed along the profile of the second gate insulating layer 230.

The second filling layer 222 may be formed on the second TiN layer 221. For example, the second filling layer 222 may contact the second TiN layer 221. The second filling layer 222 may fill the remaining space of the second trench 240t in which the second TiN layer 221 is formed.

The third gate electrode structure 320 may be formed on the third gate insulating layer 330. The third gate electrode structure 320 may fill the third trench 340t. The third gate electrode structure 320 may include a third TiN layer 321 and a third filling layer 322.

The third TiN layer 321 may be formed on the third gate insulating layer 330. The third TiN layer 321 may contact the third gate insulating layer 330. The third TiN layer 321 may extend along the sidewalls and bottom surface of the third trench 340t. The third TiN layer 321 may be formed along the profile of the third gate insulating layer 330.

The third filling layer 322 may be formed on the third TiN layer 321. For example, the third filling layer 322 may contact the third TiN layer 321. The third filling layer 322 may fill the remaining space of the third trench 340t in which the third TiN layer 321 is formed.

The first, second, and third TiN layers 121, 221 and 321 may include TiN. In some example embodiments, the first, second, and third TiN layers 121, 221 and 321 may not include TaN.

In some example embodiments, the oxygen content of the first portion 121a of the first TiN layer 121 may be greater than the oxygen content of the second portion 121b of the first TiN layer 121, the oxygen content of the second TiN layer 221 and the oxygen content of the third TiN layer 321. The first portion 121a of the first TiN layer 121 may be formed before the second portion 121b of the first TiN layer 121 is formed.

For example, after the first gate insulating layer 130 is formed in the first trench 140t, a TiN layer may be formed on the first gate insulating layer 130 along the profile of the first gate insulating layer 130. On the TiN layer, a polysilicon layer may be formed along the profile of the TiN layer. Then, the polysilicon layer may be annealed. After the annealing process, the polysilicon layer may be removed. Here, the TiN layer after the annealing process may be the first portion 121a of the first TiN layer 121. Next, a TiN layer may be formed on the first portion 121a of the first TiN layer 121 along the profile of the first portion 121a of the first TiN layer 121. The TiN layer formed on the first portion 121a of the first TiN layer 121 may be the second portion 121b of the first TiN layer 121.

Here, since the first portion 121a of the first TiN layer 121 has undergone the annealing process performed on the polysilicon layer, it may have higher oxygen content than the second portion 121b of the first TiN layer 121.

The first, second, and third filling layers 122, 222 and 322 may include the same material. The first, second, and third filling layers 122, 222 and 322 may include one of Ti, TiAl, TiAlN, TiAlC, and TiAlCN. In the semiconductor device according to the example embodiments, the first, second, and third filling layers 122, 222 and 322 is described as layers containing TiAlC.

The first, second, and third source/drain regions 150, 250 and 350 may be formed adjacent to the first, second, and third gate electrode structures 120, 220 and 320. Although each of the first, second, and third source/drain regions 150, 250 and 350 is illustrated as including an epitaxial layer formed in the substrate 100, example embodiments are not limited thereto. Each of the first, second, and third source/drain regions 150, 250 and 350 may be or include an impurity region formed by implanting impurities into the substrate 100. In addition, each of the first, second, and third source/drain regions 150, 250 and 350 may be an elevated source/drain region having an upper surface protruding above the upper surface of the substrate 100.

A second thickness t2 of the second TiN layer 221 may be less than a first thickness t1 of the first TiN layer 121 and greater than a third thickness t3 of the third TiN layer 321.

Respective threshold voltages of the first, second, and third transistors 101, 201 and 301 may be different from each other.

The threshold voltage of the second transistor 201 may be greater than, i.e. greater in absolute value than, the threshold voltage of the first transistor 101 and less than, i.e. less in absolute value than, the threshold voltage of the third transistor 301.

Each of the first, second, and third transistors 101, 201 and 301 illustrated in FIG. 1 may be a p-type transistor. Accordingly, the third transistor 301 having the largest threshold voltage. i.e. largest in absolute value, may be, for example, a p-type regular voltage transistor. In addition, the second transistor 201 may be a p-type low voltage transistor. Also, the first transistor 101 may be a p-type super low voltage transistor.

For example, in the case of the first transistor 101 and the second transistor 201 in which the first gate insulating layer 130 and the second gate insulating layer 230 do not include a lanthanum-based material, the threshold voltage of the first transistor 101 whose TiN layer has a higher oxygen content and is thicker may be less than, i.e. less in absolute value than the threshold voltage of the second transistor 201.

In addition, in the case of the second transistor 201 and the third transistor 301 in which the second gate insulating layer 230 and the third gate insulating layer 330 do not include a lanthanum-based material, the threshold voltage of the second transistor 201 whose TiN layer is thicker may be less, i.e. less in absolute value, than the threshold voltage of the third transistor 301.

In the semiconductor device according to the example embodiments including the first, second, and third transistors 101, 201 and 301 having different threshold voltages, a lanthanum-based material is not included in each of the first, second, and third gate insulating layers 130, 230 and 330, and the threshold voltage of each of the first, second, and third transistors 101, 201 and 301 can be adjusted using the thickness of the TiN layer and the oxygen content of the TiN layer.

Since a lanthanum-based material is not included in each of the first, second, and third gate insulating layers 130, 230 and 330, the lanthanum-based material may be prevented, or reduced in likelihood, from penetrating into another layer, thus increasing the threshold voltage of a corresponding transistor when the diffusion of the lanthanum-based material into each of the first, second, and third gate insulating layer 130, 230 and 330 is insufficient. Therefore, since the lanthanum-based material is not included in each of the first, second, and third gate insulating layers 130, 230 and 330, the threshold voltage of each of a plurality of transistors and a difference between the threshold voltages of the transistors can be kept relatively constant.

Figure 2:
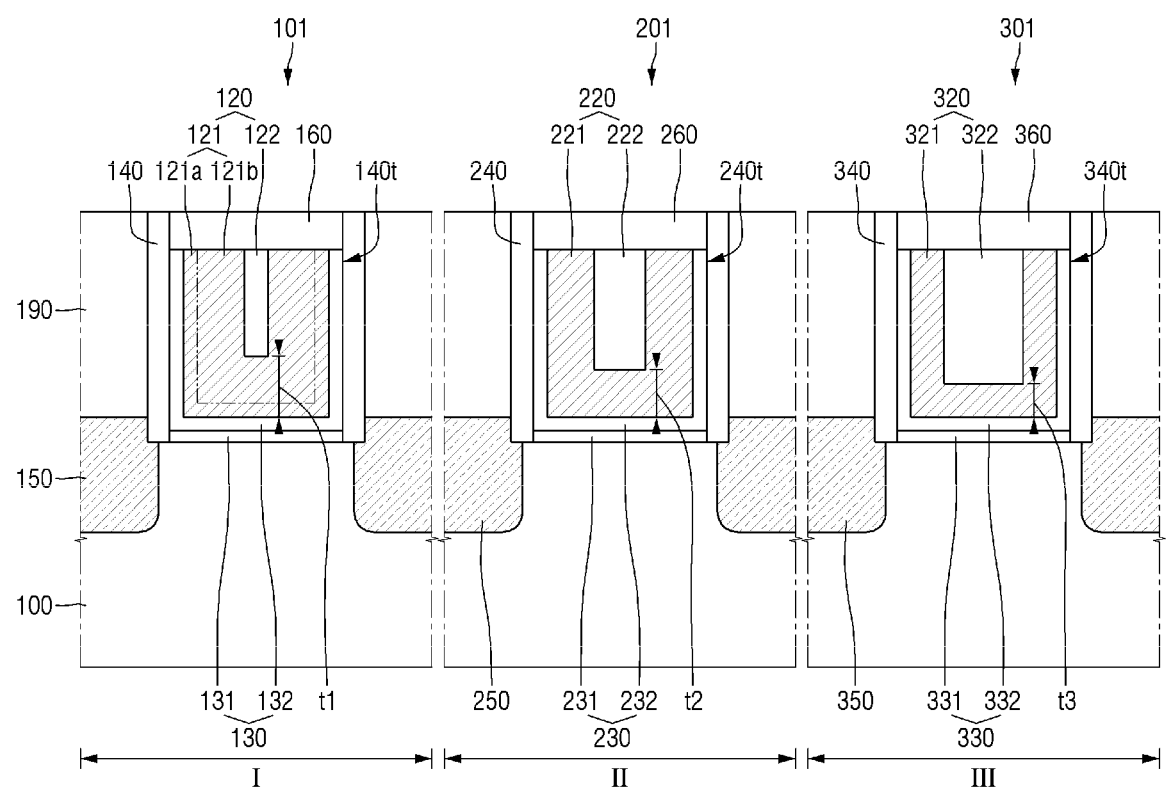

FIG. 2 illustrates a semiconductor device according to example embodiments. For ease of description, differences from the semiconductor device described above with reference to FIG. 1 will be mainly described.

Referring to FIG. 2, the semiconductor device according to the example embodiments may further include first, second, and third capping patterns 160, 260 and 360.

A first gate electrode structure 120 may fill part of a first trench 140t. An upper surface of the first gate electrode structure 120 may be closer to a substrate 100 than an upper surface of an interlayer insulating film 190.

The first capping pattern 160 may be formed on the first gate electrode structure 120. For example, the first capping pattern 160 may be formed on a first TiN layer 121 and a first filling layer 122. The first capping pattern 160 may fill the remaining space of the first trench 140t filled with the first gate electrode structure 120.

A second gate electrode structure 220 may fill part of a second trench 240t. An upper surface of the second gate electrode structure 220 may be closer to the substrate 100 than the upper surface of the interlayer insulating film 190.

The second capping pattern 260 may be formed on the second gate electrode structure 220. The second capping pattern 260 may be formed on a second TiN layer 221 and a second filling layer 222. The second capping pattern 260 may fill the remaining space of the second trench 240t filled with the second gate electrode structure 220.

A third gate electrode structure 320 may fill part of a third trench 340t. An upper surface of the third gate electrode structure 320 may be closer to the substrate 100 than the upper surface of the interlayer insulating film 190.

The third capping pattern 360 may be formed on the third gate electrode structure 320. The third capping pattern 360 may be formed on a third TiN layer 321 and a third filling layer 322. The third capping pattern 360 may fill the remaining space of the third trench 340t filled with the third gate electrode structure 320.

Since the first, second, and third capping patterns 160, 260 and 360 partially fill the first, second, and third trenches 140t, 240t and 340t, respectively, upper surfaces of the first, second, and third capping patterns 160, 260 and 360 may lie in the same plane with upper surfaces of first, second, and third gate spacers 140, 240 and 340 and the upper surface of the interlayer insulating film 190.

Each of the first, second, and third capping patterns 160, 260 and 360 may serve as a guide for forming a self-aligned contact. Therefore, each of the first, second, and third capping patterns 160, 260 and 360 may include a material having an etch selectivity with respect to the interlayer insulating film 190. Each of the first, second, and third capping patterns 160, 260 and 360 may include at least one of silicon nitride (SiN), silicon oxynitride (SiON), silicon oxide ($SiO_2$), silicon carbonitride (SiCN), silicon oxycarbonitride (SiOCN), and combinations of the same.

Unlike the illustration in the drawing, a first gate insulating layer 130 may also extend between the first gate spacers 140 and the first capping pattern 160. For example, a portion of the first gate insulating layer 130 may extend between an inner wall of each first gate spacer 140 and a sidewall of the first capping pattern 160 which faces the inner wall of the first gate spacer 140.

The degree to which each of second and third gate insulating layers 230 and 330 extends may be similar to the degree to which the first gate insulating layer 130 extends.

Figure 3:
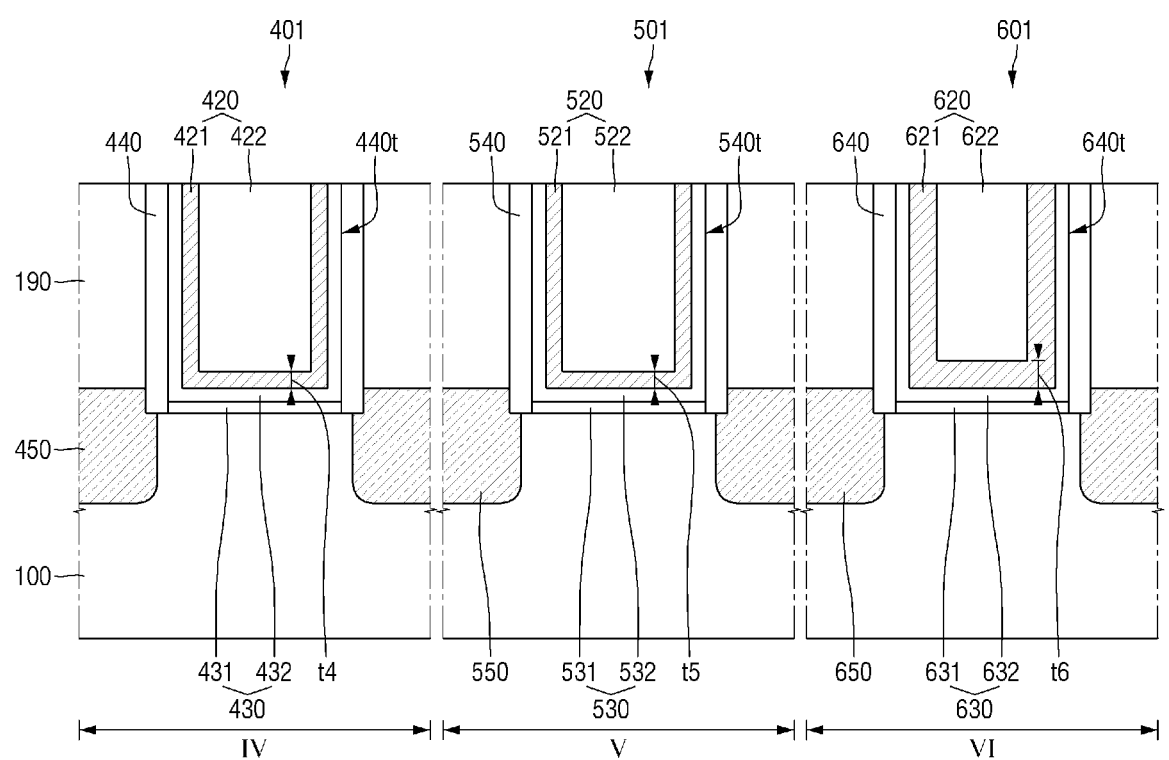

FIG. 3 illustrates a semiconductor device according to example embodiments. For ease of description, differences from the semiconductor devices described above will be mainly described.

Referring to FIG. 3, in the semiconductor device according to the example embodiments, each of fourth, fifth, and sixth areas IV, V and VI may be or include an area in which an n-channel metal oxide semiconductor (NMOS) transistor is formed. For example, each of fourth, fifth, and sixth transistors 401, 501 and 601 may be an n-type transistor.

The fourth transistor 401 may include a fourth gate insulating layer 430, a fourth gate electrode structure 420, fourth gate spacers 440, and fourth source/drain regions 450. The fifth transistor 501 may include a fifth gate insulating layer 530, a fifth gate electrode structure 520, fifth gate spacers 540, and fifth source/drain regions 550. The sixth transistor 601 may include a sixth gate insulating layer 630, a sixth gate electrode structure 620, sixth gate spacers 640, and sixth source/drain regions 650.

The elements included in each of the fourth, fifth, and sixth transistors 401, 501 and 601 will be described below.

The fourth gate spacers 440 defining a fourth trench 440t may be formed on a substrate 100 of the fourth area IV. The fifth gate spacers 540 defining a fifth trench 540t may be formed on the substrate 100 of the fifth area V. The sixth gate spacers 640 defining a sixth trench 640t may be formed on the substrate 100 of the sixth area VI.

The fourth, fifth, and sixth gate spacers 440, 540 and 640 may include the same materials as, for example, the first, second, and third gate spacers 140, 240 and 340, respectively.

In some example embodiments, like each of the first, second, and third gate spacers 140, 240 and 340, each of the fourth, fifth, and sixth gate spacers 440, 540 and 640 may include a plurality of layers.

The fourth gate insulating layer 430 may be formed on the substrate 100 of the fourth area IV. The fourth gate insulating layer 430 may extend along sidewalls and a bottom surface of the fourth trench 440t. The fourth gate insulating layer 430 may include a fourth interfacial layer 431 and a fourth high-k insulating layer 432.

The fourth interfacial layer 431 may be formed on the substrate 100. The fourth interfacial layer 431 may be formed on the bottom surface of the fourth trench 440t. The fourth high-k insulating layer 432 may be formed on the fourth interfacial layer 431. The fourth high-k insulating layer 432 may be formed along the bottom surface and sidewalls of the fourth trench 440t.

The fifth gate insulating layer 530 may be formed on the substrate 100 of the fifth area V. The fifth gate insulating layer 530 may extend along sidewalls and a bottom surface of the fifth trench 540t. The fifth gate insulating layer 530 may include a fifth interfacial layer 531 and a fifth high-k insulating layer 532.

The fifth interfacial layer 531 may be formed on the substrate 100. The fifth interfacial layer 531 may be formed on the bottom surface of the fifth trench 540t. The fifth high-k insulating layer 532 may be formed on the fifth interfacial layer 531. The fifth high-k insulating layer 532 may be formed along the bottom and sidewalls of the fifth trench 540t.

The sixth gate insulating layer 630 may be formed on the substrate 100 of the sixth area VI. The sixth gate insulating layer 630 may extend along sidewalls and a bottom surface of the sixth trench 640t. The sixth gate insulating layer 630 may include a sixth interfacial layer 631 and a sixth high-k insulating layer 632.

The sixth interfacial layer 631 may be formed on the substrate 100. The sixth interfacial layer 631 may be formed on the bottom surface of the sixth trench 640t. The sixth high-k insulating layer 632 may be formed on the sixth interfacial layer 631. The sixth high-k insulating layer 632 may be formed along the bottom and sidewalls of the sixth trench 640t.

The fourth, fifth, and sixth interfacial layers 431, 531 and 631 may include the same materials as, for example, the first, second, and third interfacial layers 131, 231 and 331, respectively. The fourth, fifth, and sixth high-k insulating layers 432, 532 and 632 may include the same materials as, for example, the first, second, and third high-k insulating layers 132, 232 and 332, respectively.

In some example embodiments, the fourth gate insulating layer 430 may include a lanthanum-based material. In addition, the fifth gate insulating layer 530 may not include a lanthanum-based material. For example, the fourth gate insulating layer 430 may include lanthanum oxide, and the fifth gate insulating layer 530 may not include lanthanum oxide.

In some example embodiments, the sixth gate insulating layer 630 may include a lanthanum-based material. Alternatively, in some example embodiments, the sixth gate insulating layer 630 may not include a lanthanum-based material.

The fourth gate electrode structure 420 may be formed on the fourth gate insulating layer 430. The fourth gate electrode structure 420 may fill the fourth trench 440t. The fourth gate electrode structure 420 may include a fourth TiN layer 421 and a fourth filling layer 422.

The fourth TiN layer 421 may be formed on the fourth gate insulating layer 430. The fourth TiN layer 421 may contact the fourth gate insulating layer 430. The fourth TiN layer 421 may extend along the sidewalls and bottom surface of the fourth trench 440t. The fourth TiN layer 421 may be formed along the profile of the fourth gate insulating layer 430.

The fourth filling layer 422 may be formed on the fourth TiN layer 421. For example, the fourth filling layer 422 may contact the fourth TiN layer 421. The fourth filling layer 422 may fill the remaining space of the fourth trench 440t in which the fourth TiN layer 421 is formed.

The fifth gate electrode structure 520 may be formed on the fifth gate insulating layer 530. The fifth gate electrode structure 520 may fill the fifth trench 540t. The fifth gate electrode structure 520 may include a fifth TiN layer 521 and a fifth filling layer 522.

The fifth TiN layer 521 may be formed on the fifth gate insulating layer 530. The fifth TiN layer 521 may contact the fifth gate insulating layer 530. The fifth TiN layer 521 may extend along the sidewalls and bottom surface of the fifth trench 540t. The fifth TiN layer 521 may be formed along the profile of the fifth gate insulating layer 530.

The fifth filling layer 522 may be formed on the fifth TiN layer 521. For example, the fifth filling layer 522 may contact the fifth TiN layer 521. The fifth filling layer 522 may fill the remaining space of the fifth trench 540t in which the fifth TiN layer 521 is formed.

The sixth gate electrode structure 620 may be formed on the sixth gate insulating layer 630. The sixth gate electrode structure 620 may fill the sixth trench 640t. The sixth gate electrode structure 620 may include a sixth TiN layer 621 and a sixth filling layer 622.

The sixth TiN layer 621 may be formed on the sixth gate insulating layer 630. The sixth TiN layer 621 may contact the sixth gate insulating layer 630. The sixth TiN layer 621 may extend along the sidewalls and bottom surface of the sixth trench 640t. The sixth TiN layer 621 may be formed along the profile of the sixth gate insulating layer 630.

The sixth filling layer 622 may be formed on the sixth TiN layer 621. For example, the sixth filling layer 622 may contact the sixth TiN layer 621. The sixth filling layer 622 may fill the remaining space of the sixth trench 640t in which the sixth TiN layer 621 is formed.

The fourth, fifth, and sixth TiN layers 421, 521 and 621 may include TiN. In some example embodiments, the fourth, fifth, and sixth TiN layers 421, 521 and 621 may not include TaN.

The fourth, fifth, and sixth filling layers 422, 522 and 622 may include the same material. The fourth, fifth, and sixth filling layers 422, 522 and 622 may include at least one of, e.g., Ti, TiAl, TiAlN, TiAlC, and TiAlCN. In the semiconductor device according to the example embodiments, the fourth, fifth, and sixth filling layers 422, 522 and 622 are described as layers containing TiAlC.

Each of the fourth, fifth, and sixth gate electrode structures 420, 520 and 620 may lie in the same plane with an upper surface of an interlayer insulating film 190.

The fourth, fifth, and sixth source/drain regions 450, 550 and 650 may be formed adjacent to the fourth, fifth, and sixth gate electrode structures 420, 520 and 620. Although each of the fourth, fifth, and sixth source/drain regions 450, 550 and 650 is illustrated as including an epitaxial layer formed in the substrate 100, embodiments are not limited to this case. Each of the fourth, fifth, and sixth source/drain regions 450, 550 and 650 may be or include an impurity region formed by implanting impurities into the substrate 100.

Alternatively or additionally, each of the fourth, fifth, and sixth source/drain regions 450, 550, 650 may be an elevated source/drain region having an upper surface protruding above an upper surface of the substrate 100.

A fourth thickness t4 of the fourth TiN layer 421 may be substantially equal to a fifth thickness t5 of the fifth TiN layer 521. The fourth TiN layer 421 and the fifth TiN layer 521 may be formed at the same level. Here, the "same level" means that the fourth TiN layer 421 and the fifth TiN layer 521 are formed by the same manufacturing process.

Respective threshold voltages of the fourth, fifth, and sixth transistors 401, 501 and 601 may be different from each other. The threshold voltage of the fifth transistor 501 may be greater in absolute value than the threshold voltage of the fourth transistor 401 and less in absolute value than the threshold voltage of the sixth transistor 601.

Each of the fourth, fifth, and sixth transistors 401, 501 and 601 illustrated in FIG. 3 may be an n-type transistor. Accordingly, the sixth transistor 601 having the largest threshold voltage, i.e. largest in absolute value, may be, for example, an n-type regular voltage transistor. In addition, the fifth transistor 501 may be an n-type low voltage transistor. Also, the fourth transistor 401 may be, for example, an n-type super low voltage transistor.

For example, in the case of the fourth transistor 401 and the fifth transistor 501 in which the fourth thickness t4 of the fourth TiN layer 421 and the fifth thickness t5 of the fifth TiN layer 521 are substantially equal, the threshold voltage of the fourth transistor 401 including the fourth gate insulating layer 430 that contains a lanthanum-based material may be less than, i.e. less in absolute value than, the threshold voltage of the fifth transistor 501.

In addition, the threshold voltage of the sixth transistor 601 including the sixth TiN layer 621 having a sixth thickness t6 greater than the fourth thickness t4 and the fifth thickness t5 may be greater in absolute value than the threshold voltage of the fifth transistor 501.

In some example embodiments, the sixth thickness t6 of the sixth TiN layer 621 may be smaller than the third thickness t3 of the third TiN layer 321 of FIG. 1.

In the semiconductor device according to the example embodiments, the fourth, fifth and transistors 401, and 501 are made to have different threshold voltages by making the fourth thickness t4 of the fourth TiN layer 421 and the fifth thickness t5 of the fifth TiN layer 521 substantially equal and by including a lanthanum-based material in the fourth gate insulating layer 430. In addition, in the fourth, fifth, and sixth transistors 401, 501 and 601 having different threshold voltages, the sixth thickness t6 is made greater than the fourth thickness t4 and the fifth thickness t5 to adjust the threshold voltage of the sixth transistor 601.

Figure 4:
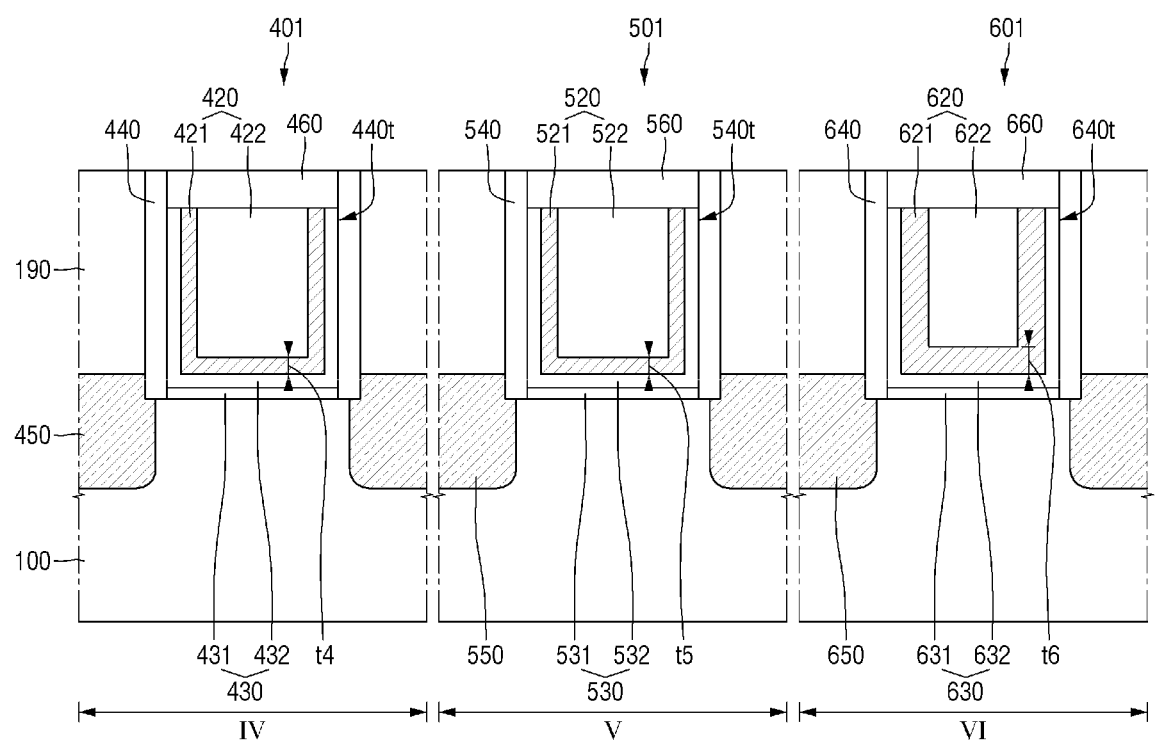

FIG. 4 illustrates a semiconductor device according to example embodiments. For ease of description, differences from the semiconductor devices described above will be mainly described.

Referring to FIG. 4, the semiconductor device according to the example embodiments may further include fourth, fifth, and sixth capping patterns 460, 560 and 660.

A fourth gate electrode structure 420 may fill part of a fourth trench 440t. An upper surface of the fourth gate electrode structure 420 may be closer to a substrate 100 than an upper surface of an interlayer insulating film 190.

The fourth capping pattern 460 may be formed on the fourth gate electrode structure 420. For example, the fourth capping pattern 460 may be formed on a fourth TiN layer 421 and a fourth filling layer 422. The fourth capping pattern 460 may fill the remaining space of the fourth trench 440t filled with the fourth gate electrode structure 420.

A fifth gate electrode structure 520 may fill part of a fifth trench 540t. An upper surface of the fifth gate electrode structure 520 may be closer to the substrate 100 than the upper surface of the interlayer insulating film 190.

The fifth capping pattern 560 may be formed on the fifth gate electrode structure 520. The fifth capping pattern 560 may be formed on a fifth TiN layer 521 and a fifth filling layer 522. The fifth capping pattern 560 may fill the remaining space of the fifth trench 540t filled with the fifth gate electrode structure 520.

A sixth gate electrode structure 620 may fill part of a sixth trench 640t. An upper surface of the sixth gate electrode structure 620 may be closer to the substrate 100 than the upper surface of the interlayer insulating film 190.

The sixth capping pattern 660 may be formed on the sixth gate electrode structure 620. The sixth capping pattern 660 may be formed on a sixth TiN layer 621 and a sixth filling layer 622. The sixth capping pattern 660 may fill the remaining space of the sixth trench 640t filled with the sixth gate electrode structure 620.

Since the fourth, fifth, and sixth capping patterns 460, 560 and 660 partially fill the fourth, fifth, and sixth trenches 440t, 540t and 640t, respectively, upper surfaces of the fourth, fifth, and sixth capping patterns 460, 560 and 660 may lie in the same plane with upper surfaces of fourth, fifth, and sixth gate spacers 440, 540 and 640 and the upper surface of the interlayer insulating film 190.

The fourth, fifth, and sixth capping patterns 460, 560 and 660 may include the same materials as, for example, the first, second, and third capping patterns 160, 260 and 360, respectively.

Unlike the illustration in the drawing, a fourth gate insulating layer 430 may also extend between the fourth gate spacers 440 and the fourth capping pattern 460. For example, a portion of the fourth gate insulating layer 430 may extend between an inner wall of each fourth gate spacer 440 and a sidewall of the fourth capping pattern 460 which faces the inner wall of the fourth gate spacer 440. The degree to which each of fifth and sixth gate insulating layers 530 and 630 extends may be similar to the degree to which the fourth gate insulating layer 430 extends.

Figure 5:
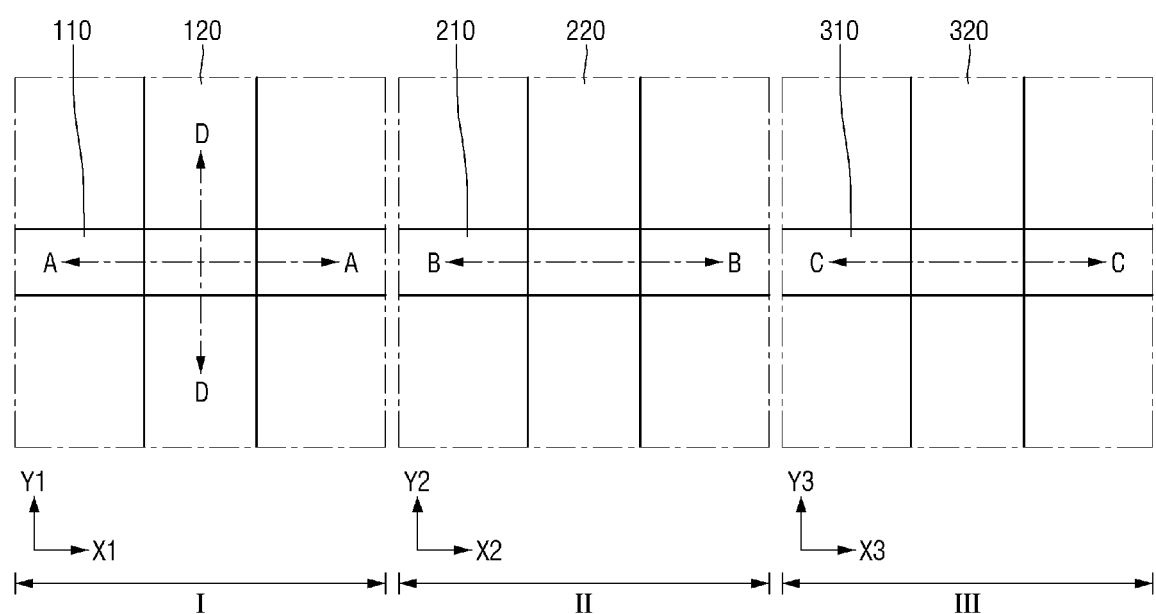
FIG. 5 is a layout view of a semiconductor device according to example embodiments.
Figure 6:
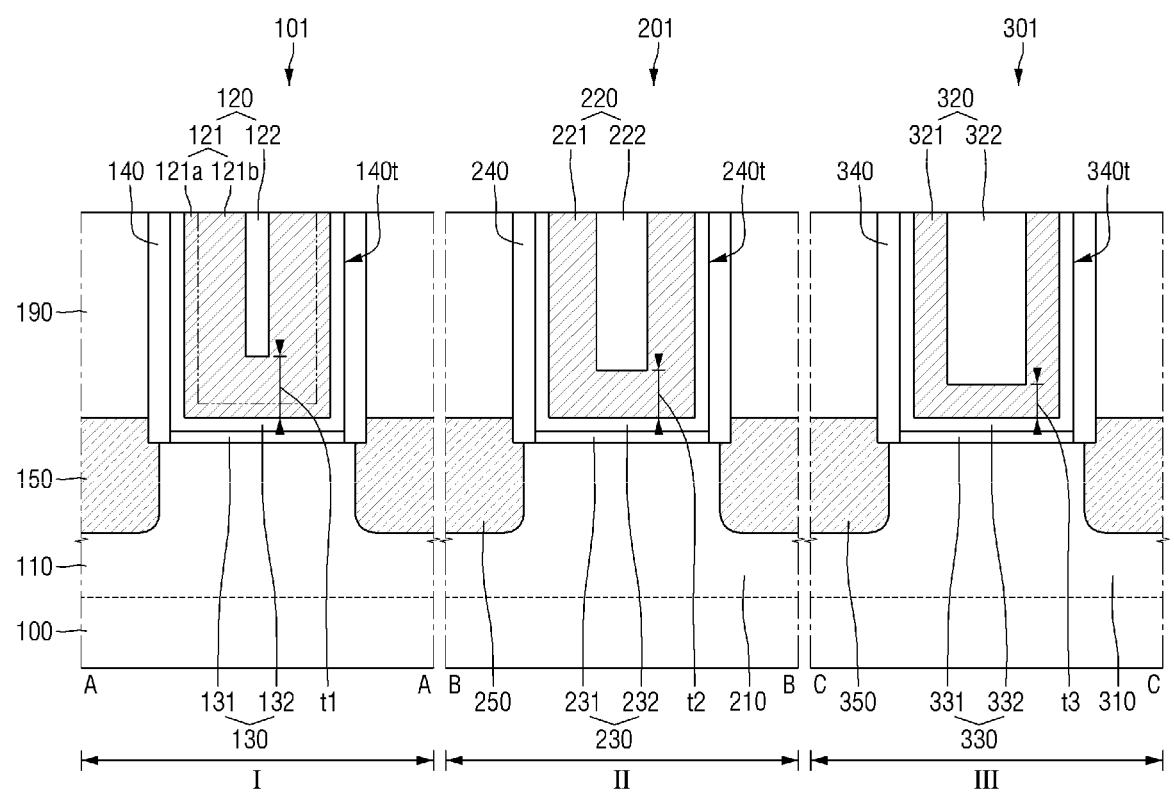
FIG. 6 is a cross-sectional view taken along the lines A-A. B-B and C-C of FIG. 5.
Figure 7:
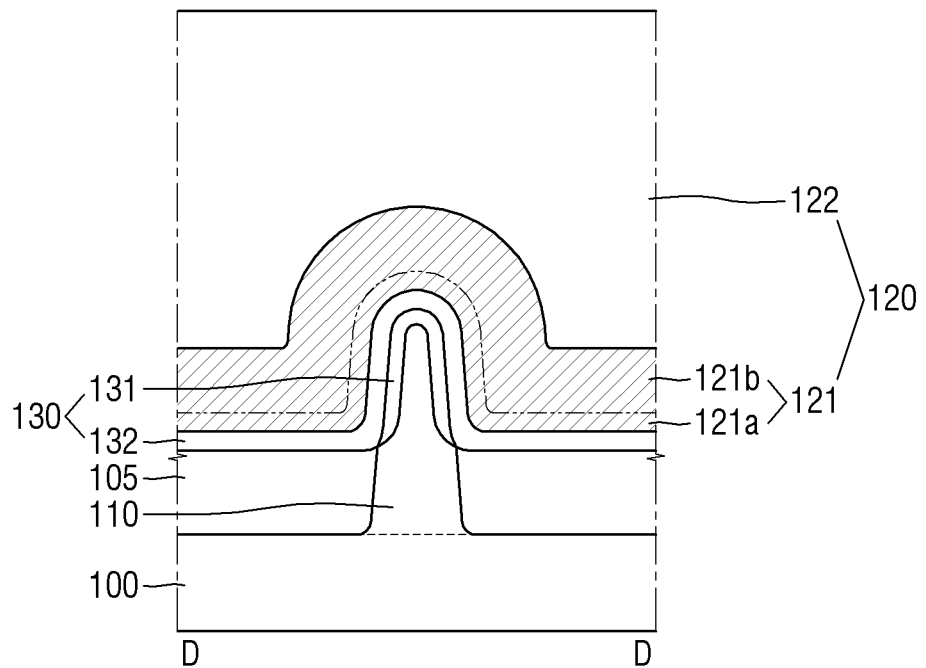
FIG. 7 is a cross-sectional view taken along the line D-D of FIG. 5.

FIG. 5 is a layout view of a semiconductor device according to example embodiments. FIG. 6 is a cross-sectional view taken along the lines A-A. B-B and C-C of FIG. 5. FIG. 7 is a cross-sectional view taken along the line D-D of FIG. 5. For ease of description, differences from the semiconductor device described above with reference to FIG. 1 will be mainly described.

For reference, FIG. 6 may be substantially similar to FIG. 1 except for fin patterns. Therefore, a description of elements and features identical to those of FIG. 1 will be given briefly or omitted. In addition, although FIG. 7 shows a cross-sectional view of only a first area I in a gate direction (Y1), those of ordinary skill in the art may understand that a cross-sectional view of a second area II in a gate direction (Y2) and a cross-sectional view of a third area III in a gate direction (Y3) may be similar to FIG. 7.

Referring to FIGS. 5 through 7, in the semiconductor device according to the example embodiments, each of first, second, and third transistors 101, 201 and 301 may be a p-type fin transistor.

The first, second, and third transistors 101, 201 and 301 may include first, second, and third fin patterns 110, 210 and 310, respectively. The first fin pattern 110 may be formed in the first area I, the second fin pattern 210 may be formed in the second area II, and the third fin pattern 310 may be formed in the third area III. Each of the first, second, and third fin patterns 110, 210 and 310 may protrude from a substrate 100. The first fin pattern 110 may extend along a first direction X1. The second fin pattern 210 may extend along a second direction X2. The third fin pattern 310 may extend along a third direction X3.

Each of the first, second, and third fin patterns 110, 210 and 310 may be a part of the substrate 100 or may include an epitaxial layer grown from the substrate 100.

Each of the first, second, and third fin patterns 110, 210 and 310 may include an elemental semiconductor material such as silicon or germanium. Alternatively, each of the first, second, and third fin patterns 110, 210 and 310 may include a compound semiconductor such as a group IV-IV compound semiconductor or a group III-V compound semiconductor. Specifically, the group IV-IV compound semiconductor that forms each of the first, second, and third fin patterns 110, 210 and 310 may be, e.g., a binary or ternary compound including two or more of carbon (C), silicon (Si), germanium (Ge) and tin (Sn) or a compound obtained by doping the binary or ternary compound with a group IV element. The group III-V compound semiconductor that forms each of the first, second, and third fin patterns 110, 210 and 310 may be, e.g., a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements). In the semiconductor device according to the example embodiments, each of the first, second, and third fin patterns 110, 210, and 310 is described as a silicon fin pattern.

A field insulating layer 105 may be on the substrate 100 and may cover at least a part of each of the first, second, and third fin patterns 110, 210 and 310. For example, since the field insulating layer 105 partially covers side surfaces of each of the first, second, and third fin patterns 110, 210 and 310, each of the first, second, and third fin patterns 110, 210 and 310 may protrude above the field insulating layer 105 formed on the substrate 100. The field insulating layer 105 may include, for example, an oxide layer, a nitride layer, an oxynitride layer, or a combination of the same.

First gate spacers 140 may be formed on the first fin pattern 110 protruding above the field insulating layer 105. The first gate spacers 140 may extend along a fourth direction Y1 and may intersect the first fin pattern 110.

Since a first trench 140t is defined by the first gate spacers 140, it may extend along the fourth direction Y1. Likewise, second gate spacers 240 may be formed on the second fin pattern 210 and may extend in a fifth direction Y2. Third gate spacer 340 may be formed on the third fin pattern 310 and may extend in a sixth direction Y3.

A first gate insulating layer 130 may be formed on the field insulating layer 105 and the first fin pattern 110. The first gate insulating layer 130 may be formed along an upper surface of the field insulating layer 105 and the profile of the first fin pattern 110. For example, the first gate insulating layer 130 may contact the upper surface of the field insulating layer 105 and the first fin pattern 110.

A first interfacial layer 131 may be formed on the first fin pattern 110. The first interfacial layer 131 may be formed along the profile of the first fin pattern 110 protruding above the upper surface of the field insulating layer 105. Although the first interfacial layer 131 is illustrated as not being formed on the upper surface of the field insulating layer 105, embodiments are not limited to this case. Depending on a method of forming the first interfacial layer 131, the first interfacial layer 131 can also be formed along the upper surface of the field insulating layer 105. A first high-k insulating layer 132 may be formed on the first interfacial layer 131 and along the profile of the first fin pattern 110 and the upper surface of the field insulating layer 105.

A description of second and third gate insulating layers 230 and 330 is substantially the same as that of the first gate insulating layer 130 and thus is omitted.

A first gate electrode structure 120 may be formed on the first gate insulating layer 130 and may intersect the first fin pattern 110. Since the first gate electrode structure 120 is formed in the first trench 140t, it may extend in the fourth direction Y1.

A first TiN layer 121 and a first filling layer 122 may be formed along the profile of the first gate insulating layer 130. As described above, the oxygen content of a first portion 121a of the first TiN layer 121 may be greater than the oxygen content of a second portion 121b of the first TiN layer 121, the oxygen content of a second TiN layer 221, and the oxygen content of a third TiN layer 321.

A second gate electrode structure 220 may be formed on the second gate insulating layer 230 and may intersect the second fin pattern 210. Since the second gate electrode structure 220 is formed in a second trench 240t, it may extend in the fifth direction Y2.

A third gate electrode structure 320 may be formed on the third gate insulating layer 330 and may intersect the third fin pattern 310. Since the third gate electrode structure 320 is formed in a third trench 340t, it may extend in the sixth direction Y3.

A description of a TiN layer and a filling layer included in each of the second and third gate electrode structures 220 and 320 may be substantially similar to that of the first TiN layer 121 and the first filling layer 122, except for the description of the first portion 121a of the first TiN layer 121.

First source/drain regions 150 may be formed in the first fin pattern 110, second source/drain regions 250 may be formed in the second fin pattern 210, and third source/drain regions 350 may be formed in the third fin pattern 310.

Figure 8:
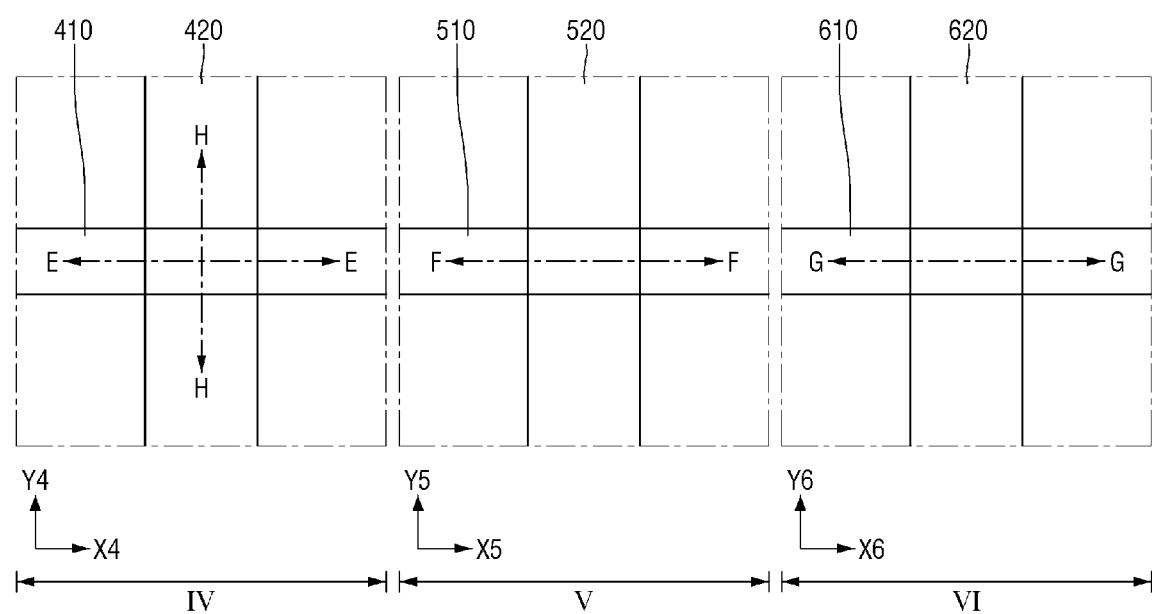
FIG. 8 is a layout view of a semiconductor device according to example embodiments.
Figure 9:
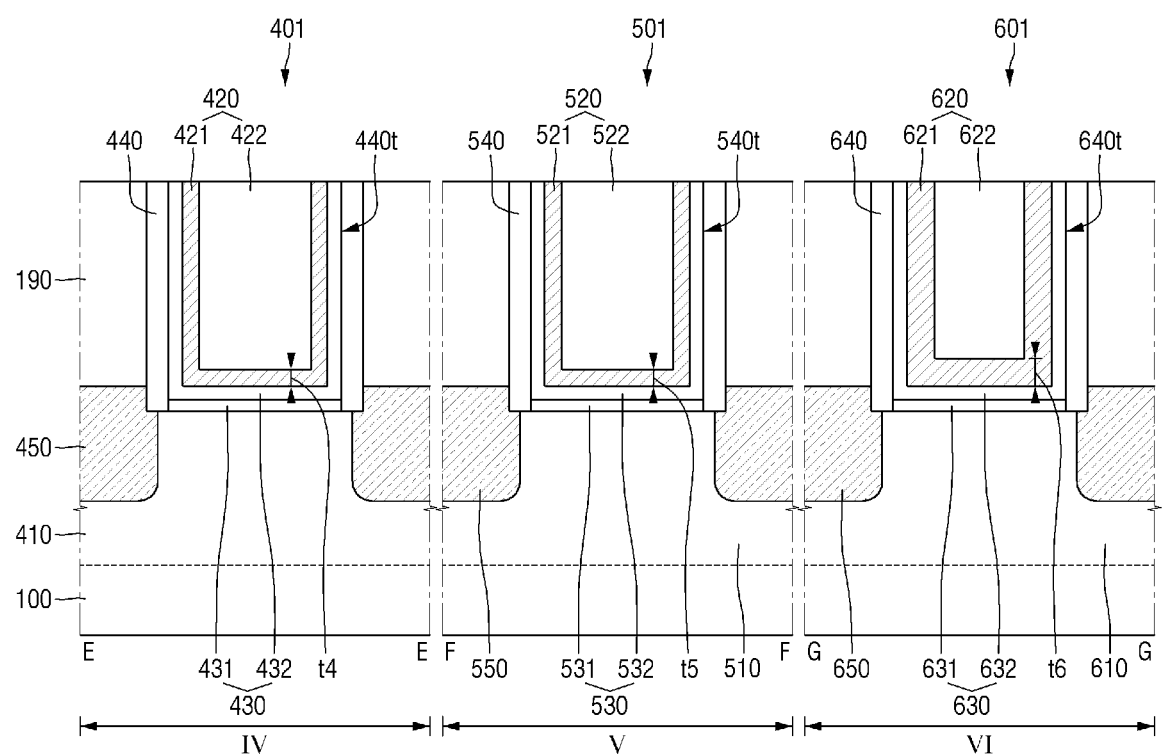
FIG. 9 is a cross-sectional view taken along the lines E-E, F-F and G-G of FIG. 8.
Figure 10:
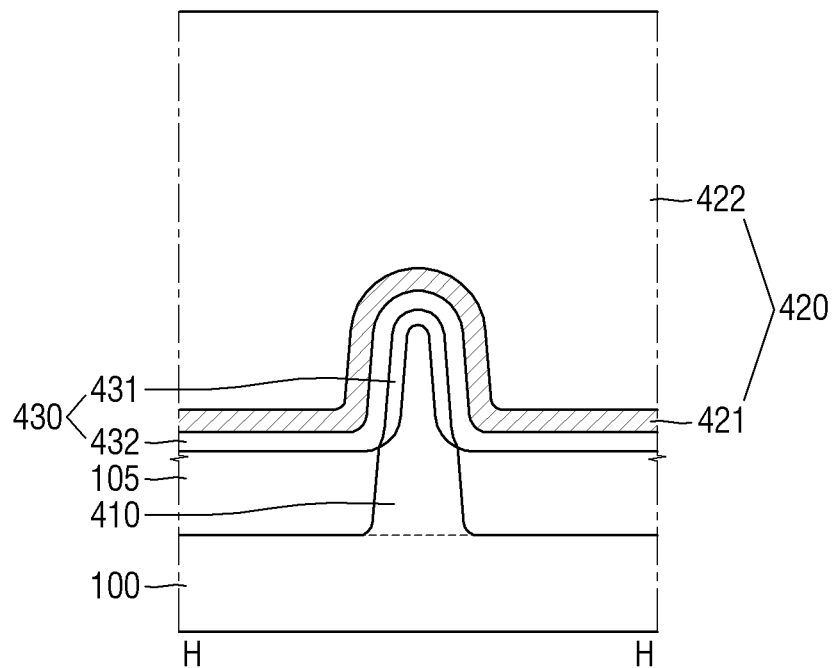
FIG. 10 is a cross-sectional view taken along the line H-H of FIG. 8.

FIG. 8 is a layout view of a semiconductor device according to example embodiments. FIG. 9 is a cross-sectional view taken along the lines E-E, F-F and G-G of FIG. 8. FIG. 10 is a cross-sectional view taken along the line H-H of FIG. 8. For ease of description, differences from the semiconductor device described above with reference to FIG. 3 will be mainly described.

For reference, FIG. 9 may be substantially similar to FIG. 3 except for fin patterns. Therefore, a description of elements and features identical to those of FIG. 3 will be given briefly or omitted. In addition, although FIG. 10 shows a cross-sectional view of only a fourth area IV in a gate direction (Y4), those of ordinary skill in the art may understand that a cross-sectional view of a fifth area V in a gate direction (Y5) and a cross-sectional view of a sixth area VI in a gate direction (Y6) may be similar to FIG. 10.

Referring to FIGS. 8 through 10, in the semiconductor device according to the example embodiments, each of fourth, fifth, and sixth transistors 401, 501 and 601 may be an n-type fin transistor. The fourth, fifth, and sixth transistors 401, 501 and 601 may include fourth, fifth, and sixth fin patterns 410, 510 and 610, respectively.

The fourth fin pattern 410 may be formed in the fourth area IV, the fifth fin pattern 510 may be formed in the fifth area V, and the sixth fin pattern 610 may be formed in the sixth area VI. Each of the fourth, fifth, and sixth fin patterns 410, 510 and 610 may protrude from a substrate 100. The fourth fin pattern 410 may extend along a seventh direction X4. The fifth fin pattern 510 may extend along an eighth direction X5. The sixth fin pattern 610 may extend along a ninth direction X6. Each of the fourth, fifth, and sixth fin patterns 410, 510 and 610 may be a part of the substrate 100 or may include an epitaxial layer grown from the substrate 100.

The fourth, fifth, and sixth fin patterns 410, 510 and 610 may include the same materials as, for example, the first, second, and third fin patterns 110, 210 and 310, respectively.

Fourth gate spacers 440 may be formed on the fourth fin pattern 410 protruding above a field insulating layer 105. The fourth gate spacers 440 may extend along a tenth direction Y4 and may intersect the fourth fin pattern 410.

Since a fourth trench 440t is defined by the fourth gate spacers 440, it may extend along the tenth direction Y4. Likewise, fifth gate spacers 540 may be formed on the fifth fin pattern 510 and may extend in an eleventh direction Y5. Sixth gate spacer 640 may be formed on the sixth fin pattern 610 and may extend in a twelfth direction Y6.

A fourth gate insulating layer 430 may be formed on the field insulating layer 105 and the fourth fin pattern 410. The fourth gate insulating layer 430 may be formed along an upper surface of the field insulating layer 105 and the profile of the fourth fin pattern 410. For example, the fourth gate insulating layer 430 may contact the upper surface of the field insulating layer 105 and the fourth fin pattern 410.

A fourth interfacial layer 431 may be formed on the fourth fin pattern 410. The fourth interfacial layer 431 may be formed along the profile of the fourth fin pattern 410 protruding above the upper surface of the field insulating layer 105. Although the fourth interfacial layer 431 is illustrated as not being formed on the upper surface of the field insulating layer 105, embodiments are not limited to this case. Depending on a method of forming the fourth interfacial layer 431, the fourth interfacial layer 431 can also be formed along the upper surface of the field insulating layer 105. A fourth high-k insulating layer 432 may be formed on the fourth interfacial layer 431 and along the profile of the fourth fin pattern 410 and the upper surface of the field insulating layer 105. A description of fifth and sixth gate insulating layers 530 and 630 is substantially the same as that of the fourth gate insulating layer 430 and thus is omitted.

A fourth gate electrode structure 420 may be formed on the fourth gate insulating layer 430 and may intersect the fourth fin pattern 410. Since the fourth gate electrode structure 420 is formed in the fourth trench 440t, it may extend in the tenth direction Y4.

A fourth TiN layer 421 and a fourth filling layer 422 may be formed along the profile of the fourth gate insulating layer 430.

A fifth gate electrode structure 520 may be formed on the fifth gate insulating layer 530 and may intersect the fifth fin pattern 510. Since the fifth gate electrode structure 520 is formed in a fifth trench 540t, it may extend in the eleventh direction Y5. A sixth gate electrode structure 620 may be formed on the sixth gate insulating layer 630 and may intersect the sixth fin pattern 610. Since the sixth gate electrode structure 620 is formed in a sixth trench 640t, it may extend in the twelfth direction Y12.

A description of a TiN layer and a filling layer included in each of the fifth and sixth gate electrode structures 520 and 620 may be substantially similar to that of the fourth TiN layer 421 and the fourth filling layer 422.

Fourth source/drain regions 450 may be formed in the fourth fin pattern 410, fifth source/drain regions 550 may be formed in the fifth fin pattern 510, and sixth source/drain regions 650 may be formed in the sixth fin pattern 610.

Figure 11:
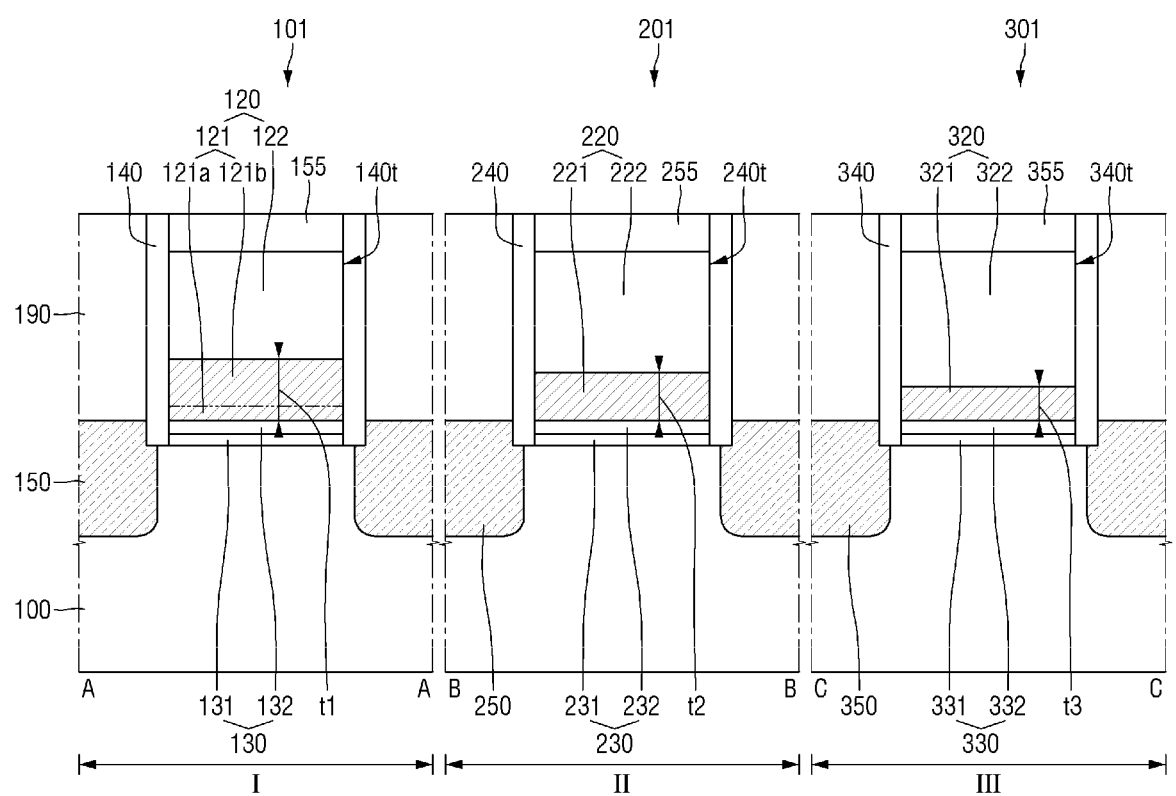
FIGS. 11 and 12 respectively illustrate semiconductor devices according to example embodiments.

FIG. 11 illustrates a semiconductor device according to example embodiments. For ease of description, differences from the semiconductor device described above with reference to FIG. 1 will be mainly described.

Referring to FIG. 11, in the semiconductor device according to the example embodiments, a first high-k insulating layer 132 may not include portions extending between a first gate electrode structure 120 and first gate spacers 140. In addition, a first TiN layer 121 and a first filling layer 122 of the first gate electrode structure 120 may not include portions extending along inner walls of the first gate spacers 140.

In some example embodiments, a first portion 121a of the first TiN layer 121 may be interposed between a second portion 121b of the first TiN layer 121 and a first gate insulating layer 130. As described above, the oxygen content of the first portion 121a of the first TiN layer 121 may be greater than the oxygen content of the second portion 121b of the first TiN layer 121, the oxygen content of a second TiN layer 221, and the oxygen content of a third TiN layer 321.

A description of second and third high-k insulating layers 232 and 332 may be substantially similar to that of the first high-k insulating layer 132. In addition, a description of a TiN layer and a filling layer included in each of second and third gate electrode structures 220 and 320 may be substantially similar to that of the first TiN layer 121 and the first filling layer 122, except for the description of the first portion 121a of the first TiN layer 121.

In FIG. 11, a second thickness t2 of the second TiN layer 221 may be smaller than a first thickness t11 of the first TiN layer 121 and greater than a third thickness t3 of the third TiN layer 321.

Although first, second, and third gate hard masks 155, 255 and 355 are illustrated as being formed on the first, second, and third gate electrode structures 120, 220 and 320 in FIG. 11, embodiments are not limited to this case.

Figure 12:
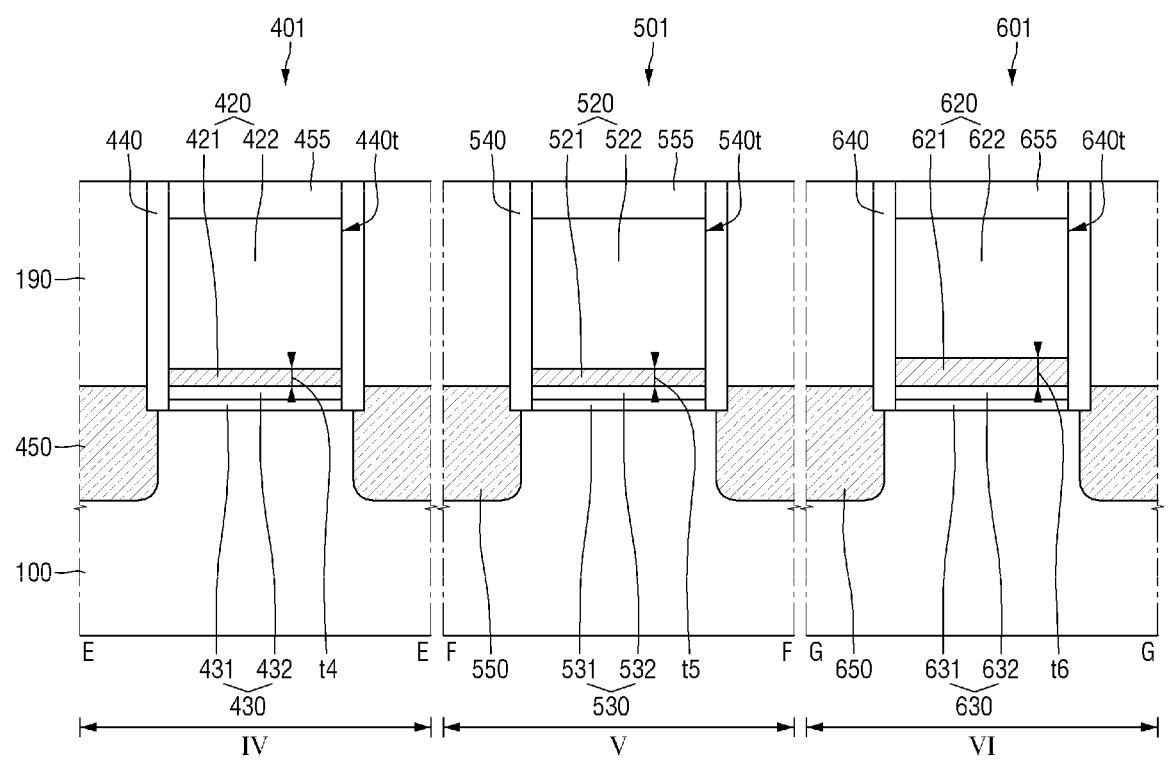

FIG. 12 illustrates a semiconductor device according to example embodiments. For ease of description, differences from the semiconductor device described above with reference to FIG. 3 will be mainly described.

Referring to FIG. 12, in the semiconductor device according to the example embodiments, a fourth high-k insulating layer 432 may not include portions extending between a fourth gate electrode structure 420 and fourth gate spacers 440. In addition, a fourth TiN layer 421 and a fourth filling layer 422 of the fourth gate electrode structure 420 may not include portions extending along inner walls of the fourth gate spacers 440.

A description of fifth and sixth high-k insulating layers 532 and 632 may be substantially similar to that of the fourth high-k insulating layer 432.

In addition, a description of a TiN layer and a filling layer included in each of fifth and sixth gate electrode structures 520 and 620 may be substantially similar to that of the fourth TiN layer 421 and the fifth filling layer 522.

In FIG. 12, a fifth thickness t5 of a fifth TiN layer 521 may be substantially equal to a fourth thickness t4 of the fourth TiN layer 421. In addition, the fourth thickness t4 and the fifth thickness t5 may be smaller than a sixth thickness t6 of a sixth TiN layer 621.

Although fourth, fifth, and sixth gate hard masks 455, 555 and 655 are illustrated as being formed on the fourth, fifth, and sixth gate electrode structures 420, 520 and 620 in FIG. 12, embodiments are not limited to this case.

While the present inventive concept has been particularly shown and described with reference to exemplary embodiments thereof, those of ordinary skill in the art may understand that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
   a substrate including a first area and a second area; and
   first and second transistors formed in the first area and the second area, respectively,
   wherein the first transistor includes a first gate insulating layer on the substrate, a first TiN layer on the first gate insulating layer contacting the first gate insulating layer, and a first filling layer on the first TiN layer, and
   the second transistor includes a second gate insulating layer on the substrate, a second TiN layer on the second gate insulating layer contacting the second gate insulating layer, and a second filling layer on the second TiN layer,
   wherein a threshold voltage of the first transistor is less in absolute value than that of the second transistor, the second gate insulating layer does not comprise a lanthanum-based material, and an oxygen content of a portion of the first TiN layer is greater than that of an oxygen content of the second TiN layer.

2. The semiconductor device of claim 1, wherein a first thickness of the first TiN layer is greater than a second thickness of the second TiN layer.

3. The semiconductor device of claim 1, the semiconductor device further comprises:
   a third transistor formed in a third area of the substrate,
   wherein the third transistor includes a third gate insulating layer on the substrate, a third TiN layer on the third gate insulating layer contacting the third gate insulating layer, and a third filling layer formed on the third TiN layer,
   wherein the first transistor and the second transistor are each a p-channel metal oxide semiconductor (PMOS) transistor, the third transistor is an n-channel metal oxide semiconductor (NMOS) transistor, and the third gate insulating layer comprises a lanthanum-based material.

4. The semiconductor device of claim 3, further comprising:
   a fourth transistor in a fourth area of the substrate, the fourth transistor being an NMOS transistor,
   wherein the fourth transistor includes a fourth gate insulating layer on the substrate, a fourth TiN layer on the fourth gate insulating layer contacting the fourth gate insulating layer, and a fourth filling layer on the fourth TiN layer,
   wherein a third thickness of the third TiN layer is equal to a fourth thickness of the fourth TiN layer, a threshold voltage of the third transistor is less in absolute value than a threshold voltage of the fourth transistor, and the fourth gate insulating layer does not include a lanthanum-based material.

5. The semiconductor device of claim 1, further comprising:
   a first trench formed in the first area of the substrate; and
   a second trench formed in the second area of the substrate, wherein the first gate insulating layer, the first TiN layer and the first filling layer fill the first trench, and the second gate insulating layer, the second TiN layer, and the second filling layer fill the second trench.

6. The semiconductor device of claim 5, wherein the first filling layer and the second filling layer comprise titanium aluminum carbon (TiAlC).

7. A semiconductor device comprising:
a substrate including first, second, third, fourth, fifth, and sixth areas;
first, second, and third transistors respectively formed in the first through third areas, the first through third transistors being PMOS transistors; and
fourth, fifth, and sixth transistors respectively formed in the fourth through sixth areas, the fourth through sixth transistors being NMOS transistors,
wherein the first transistor includes a first gate insulating layer on the substrate, a first TiN layer on the first gate insulating layer contacting the first gate insulating layer, and a first filling layer on the first TiN layer,
the second transistor includes a second gate insulating layer on the substrate, a second TiN layer on the second gate insulating layer contacting the second gate insulating layer, and a second filling layer on the second TiN layer,
the third transistor includes a third gate insulating layer on the substrate, a third TiN layer on the third gate insulating layer contacting the third gate insulating layer, and a third filling layer on the third TiN layer,
the fourth transistor includes a fourth gate insulating layer on the substrate, a fourth TiN layer on the fourth gate insulating layer contacting the fourth gate insulating layer, and a fourth filling layer on the fourth TiN layer,
the fifth transistor includes a fifth gate insulating layer on the substrate, a fifth TiN layer on the fifth gate insulating layer contacting the fifth gate insulating layer, and a fifth filling layer on the fifth TiN layer, and
the sixth transistor includes a sixth gate insulating layer on the substrate, a sixth TiN layer on the sixth gate insulating layer contacting the sixth gate insulating layer, and a sixth filling layer on the sixth TiN layer,
wherein a second thickness of the second TiN layer is less than a first thickness of the first TiN layer and greater than a third thickness of the third TiN layer,
a fourth thickness of the fourth TiN layer and a fifth thickness of the fifth TiN layer are less than a sixth thickness of the sixth TiN layer,
the fourth gate insulating layer comprises a lanthanum-based material, and
the second gate insulating layer does not comprise a lanthanum-based material.

8. The semiconductor device of claim 7, wherein an oxygen content of a portion of the first TiN layer is greater than that of the second TiN layer.

9. The semiconductor device of claim 8, wherein the portion of the first TiN layer directly contacts the first gate insulating layer.

10. The semiconductor device of claim 7, wherein a threshold voltage of the second transistor is greater in absolute value than that of the first transistor and less in absolute value than that of the third transistor, and
a threshold voltage of the fifth transistor is greater in absolute value than that of the fourth transistor and less in absolute value than that of the sixth transistor.

11. The semiconductor device of claim 7, wherein the fourth thickness of the fourth TiN layer and the fifth thickness of the fifth TiN layer are equal.

12. The semiconductor device of claim 7, further comprising:
first, second, and third fin patterns protruding from the substrate and in the first through third areas, respectively; and
a field insulating layer partially covering the first through third fin patterns,
wherein the first gate insulating layer contacts the first fin pattern and an upper surface of the field insulating layer, the second gate insulating layer contacts the second fin pattern and the upper surface of the field insulating layer, the third gate insulating layer contacts the third fin pattern and the upper surface of the field insulating layer, and
the first through third filling layers contact the first through third TiN layers, respectively.

13. A semiconductor device comprising:
a substrate comprising first, second, and third areas; and
first, second, and third transistors respectively formed in the first through third areas, the first through third transistors being PMOS transistors,
wherein the first transistor includes a first gate insulating layer on the substrate, a first TiN layer on the first gate insulating layer contacting the first gate insulating layer, and a first filling layer on the first TiN layer,
the second transistor includes a second gate insulating layer on the substrate, a second TiN layer on the second gate insulating layer contacting the second gate insulating layer, and a second filling layer on the second TiN layer, and
the third transistor includes a third gate insulating layer on the substrate, a third TiN layer on the third gate insulating layer contacting the third gate insulating layer, and a third filling layer on the third TiN layer,
wherein a second thickness of the second TiN layer is less than a first thickness of the first TiN layer and greater than a third thickness of the third TiN layer, and
an oxygen content of a portion of the first TiN layer is greater than an oxygen content of the second TiN layer and an oxygen content of the third TiN layer.

14. The semiconductor device of claim 13, wherein a threshold voltage of the second transistor is greater in absolute value than a threshold voltage of the first transistor and less in absolute value than a threshold voltage of the third transistor.

15. The semiconductor device of claim 13, wherein the second gate insulating layer does not comprise a lanthanum-based material.

16. The semiconductor device of claim 13, wherein the substrate further comprises fourth and fifth areas and further comprising fourth and fifth transistors respectively formed in the fourth and fifth areas, the fourth and fifth transistors being NMOS transistors,
wherein the fourth transistor includes a fourth gate insulating layer on the substrate, a fourth TiN layer on the fourth gate insulating layer contacting the fourth gate insulating layer, and a fourth filling layer on the fourth TiN layer, and
the fifth transistor includes a fifth gate insulating layer on the substrate, a fifth TiN layer on the fifth gate insulating layer contacting the fifth gate insulating layer, and a fifth filling layer on the fifth TiN layer,
wherein a threshold voltage of the fourth transistor is less in absolute value than a threshold voltage of the fifth transistor, the fourth gate insulating layer comprises a lanthanum-based material, and the fifth gate insulating layer does not comprise a lanthanum-based material.

17. The semiconductor device of claim 16, wherein a fourth thickness of the fourth TiN layer and a fifth thickness of the fifth TiN layer are equal.

18. The semiconductor device of claim 16, further comprising a sixth transistor formed in a sixth area of the substrate, the sixth transistor being an NMOS transistor,
wherein the sixth transistor includes a sixth gate insulating layer on the substrate, a sixth TiN layer on the sixth gate insulating layer contacting the sixth gate insulating layer, and a sixth filling layer on the sixth TiN layer,
wherein a threshold voltage of the sixth transistor is greater in absolute value than a threshold voltage of the fifth transistor, and a sixth thickness of the sixth TiN layer is less than the third thickness of the third TiN layer.

19. The semiconductor device of claim 18, wherein the sixth gate insulating layer comprises a lanthanum-based material.

20. The semiconductor device of claim 18, wherein the sixth gate insulating layer does not comprise a lanthanum-based material.

* * * * *